(12) United States Patent
Havens

(10) Patent No.: US 6,914,431 B2
(45) Date of Patent: Jul. 5, 2005

(54) MRI SYSTEM WITH PULSED READOUT MAGNET

(75) Inventor: Timothy J. Havens, Florence, SC (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/249,089

(22) Filed: Mar. 14, 2003

(65) Prior Publication Data

US 2004/0178791 A1 Sep. 16, 2004

(51) Int. Cl.[7] .................................................. G01V 3/00
(52) U.S. Cl. ..................................................... 324/318
(58) Field of Search ................................. 324/300–309, 324/318–320; 335/296, 300–302, 306

(56) References Cited

U.S. PATENT DOCUMENTS

| | | | |
|---|---|---|---|
| 5,291,169 A | | 3/1994 | Ige et al. |
| 5,389,909 A | | 2/1995 | Havens |
| 5,517,168 A | * | 5/1996 | Dorri et al. .................. 335/301 |
| 5,517,169 A | * | 5/1996 | Laskaris et al. ............. 335/301 |
| 5,521,571 A | * | 5/1996 | Laskaris et al. ............. 335/216 |
| 5,574,417 A | * | 11/1996 | Dorri et al. .................. 335/216 |
| 5,650,903 A | | 7/1997 | Gross et al. |
| 5,696,476 A | | 12/1997 | Havens et al. |
| 5,835,995 A | * | 11/1998 | Macovski et al. ........... 324/309 |
| 5,999,075 A | * | 12/1999 | Laskaris et al. ............. 335/299 |
| 6,100,780 A | * | 8/2000 | Dorri et al. .................. 335/216 |
| 6,163,154 A | * | 12/2000 | Anderson et al. ........... 324/320 |
| 6,208,143 B1 | * | 3/2001 | Conolly et al. .............. 324/319 |
| 6,404,197 B1 | * | 6/2002 | Anderson et al. ........... 324/311 |
| 6,570,475 B1 | * | 5/2003 | Lvovsky et al. ............. 335/216 |
| 6,593,742 B1 | * | 7/2003 | Conolly et al. .............. 324/318 |
| 6,600,318 B1 | * | 7/2003 | Kakugawa et al. ......... 324/318 |
| 6,646,836 B2 | * | 11/2003 | Yoshikawa ................... 361/19 |

FOREIGN PATENT DOCUMENTS

EP     0 757 256 B1     7/2000

* cited by examiner

Primary Examiner—Brij Shrivastav
Assistant Examiner—Dixomara Vargas
(74) Attorney, Agent, or Firm—Peter J. Vogel

(57) ABSTRACT

A Magnetic Resonance Imaging (MRI) system 50 is provided including a superconducting magnet coil assembly 54. The magnet coil assembly 54 includes a superconducting magnet 82 and forms an imaging volume 60. The superconducting magnet 82 generates a polarizing field in the imaging volume 60. A readout magnet 106 generates a readout field in the imaging volume 60. A controller 102 is electrically coupled to the readout magnet 106 and pulses the readout magnet 106 to generate a uniform magnetic field through the imaging volume 60. A method for performing the same is also provided.

20 Claims, 9 Drawing Sheets

MRI SYSTEM WITH PULSED READOUT MAGNET

BACKGROUND OF INVENTION

The present invention relates generally to Magnetic Resonance Imaging (MRI) systems, and more particularly, to an improved method and system for generating a uniform magnetic field in an open architecture imaging volume.

A typical MRI system having an open architecture is located within an unshielded MRI room and includes a static magnet structure having a fore section and an aft section. A cryostat having a pair of toroidally shaped vessels containing a superconducting magnet are included within the magnetic structure for cooling the superconducting magnet. The vessels are attached by steel spacers and define a patient volume. The length of the spacers corresponds with an amount of available space for a physician to treat a patient. The patient lies on a table that extends within the patient volume.

As a part of a typical MRI, radio frequency (RF) signals of suitable frequencies are transmitted into the patient volume, via RF transmit coils. The superconducting magnet generates a static magnet field for polarizing the hydrogen atoms of the patient. Nuclear magnetic resonance (nMR) responsive RF signals are emitted by the polarized protons, and received from the imaging volume by RF receiver coils. Information encoded within the frequency and phase parameters of the received RF signals, by the use of a RF circuit, is processed to form visual images. These visual images represent the distribution of nMR nuclei within a cross-section or volume of the patient within the imaging volume.

Magnetic Resonance (MR) imaging requires a highly uniform magnetic field to generate good quality images. To increase imaging quality it is desirable to increase field strength of the magnet field. By increasing magnetic field strength stray MR field increases. Thus, a field strength limitation arises when maintaining stray MR field below a specified level to not effect individuals outside of the MRI room. To shield a MRI room from a surrounding environment is sometimes costly and impractical.

Referring now to FIG. 1, a cross-sectional area plot of a superconducting magnet 6 and imaging volume 8 for a typical 0.5 Tesla MRI system having an open architecture, is shown. The vertical axis is R in centimeters, and the horizontal axis is Z also in centimeters. The rectangular areas 10 represent the cryostat. The positive areas 12 correspond to positive cross-sectional areas of the superconducting coils, which are directly proportional to electromagnetic forces generated therein. The negative areas 14 correspond to negative cross-sectional areas of the superconducting coils, which are directly proportional to electromagnetic forces generated therein. A typical 0.5 Tesla open superconducting magnet, as the one in this example, has approximately 100,000 cubic centimeters of superconductor. This MRI system has a coil to coil gap of 60 cm, which yields a room temperature gap of approximately 50 cm for physician access. It is known that a 55 cm room temperature gap is the minimum acceptable for interventional procedures, thus prior art MRI system design does not satisfy the minimal acceptable gap requirement.

Referring now to FIG. 2, a cross-sectional area plot of a 0.5 Tesla superconducting magnet and imaging volume for the typical MRI system with increased gap for improved physician access and increased superconducting magnet forces, is shown. Increasing coil to coil gap from 60 cm to 76 cm for improved physician access has resulted in increased forces between the superconducting coils. Comparing positive areas 12 and negative areas 14 of FIG. 2 with positive areas 12 and negative areas 14 of FIG. 1, it becomes obvious the difference in superconducting magnet size and electromagnetic forces necessary to generate a magnet with significantly improved physician access for interventional procedures, using the traditional MRI system. The superconducting magnet, of FIG. 2, has approximately 392,000 cubic centimeters of superconductor and relatively increased magnetic forces, which is clearly not feasible to build.

A concept has been suggested to generate and combine a pulsing polarizing field of poor homogeneity and high amplitude with a static readout field of good homogeneity and small amplitude to produce images. The pulsed polarizing field is generated from a resistive polarizing magnet. However, the polarizing field must be pulsed at a high duty cycle rate to achieve acceptable imaging times. The high duty cycle of the polarizing magnet generates large resistive heating that require a large amount of cooling power within the MRI system. Cooling of the MRI system is a limitation with current MRI systems, which further causes this concept to be costly and impractical. Another disadvantage with this concept is that it only has limited pulsing sequence options, which restricts the amount of different medical conditions a physician is able to view.

Additionally, available design configurations of the open architecture MRI system are limited. For example, the amount of space available for a treating physician is constrained by the MRI system physical and operational requirements. Depending upon a treatment being implemented, a physician may desire different amounts of space or different orientations of the space available.

It would therefore be desirable to design an open architecture MRI system that provides potentially increased magnetic field uniformity, that minimizes generated stray field, that provides multiple feasible pulsing sequence options, and multiple design configurations.

SUMMARY OF INVENTION

The present invention provides a method and apparatus for generating a uniform magnetic field in an imaging volume. A Magnetic Resonance Imaging (MRI) system is provided including a superconducting magnet coil assembly. The magnet coil assembly includes a superconducting magnet and forms an imaging volume. The superconducting magnet generates a static polarizing field in the imaging volume. A pulsing readout magnet generates a readout field in the imaging volume that, when added to the static polarizing field produces a homogeneous field. A controller is electrically coupled to the readout magnet and pulses the readout magnet to generate a uniform magnetic field through the imaging volume. A method for performing the same is also provided. The controller can frequently be removed from the superconducting magnet once it is energized.

One of several advantages of the present invention is the ability to generate a polarizing field of poor homogeneity and a readout field of good homogeneity simultaneously within an imaging volume. The combination of a superconducting magnet with high magnetic field strength and a resistive readout magnet of low magnetic field strength eliminates the need for operating a resistive polarizing magnet with high magnetic field strength at a high duty cycle. This substantially reduces the power loss and cooling requirements.

Another advantage of the present invention is increased design versatility. The present invention, by providing the same or improved imaging volume magnet field uniformity without the typical physical restraints on MRI system componentry provides for increased treating area for a physician and design versatility.

Furthermore, the present invention provides multiple sequencing options. The multiple sequencing options allow an examiner to highlight an increased number of different medical conditions using a single MRI system.

The present invention itself, together with attendant advantages, will be best understood by reference to the following detailed description, taken in conjunction with the accompanying figures.

BRIEF DESCRIPTION OF DRAWINGS

For a more complete understanding of this invention reference should now be had to the embodiments illustrated in greater detail in the accompanying figures and described below by way of examples of the invention wherein:.

DETAILED DESCRIPTION

Figure 1:
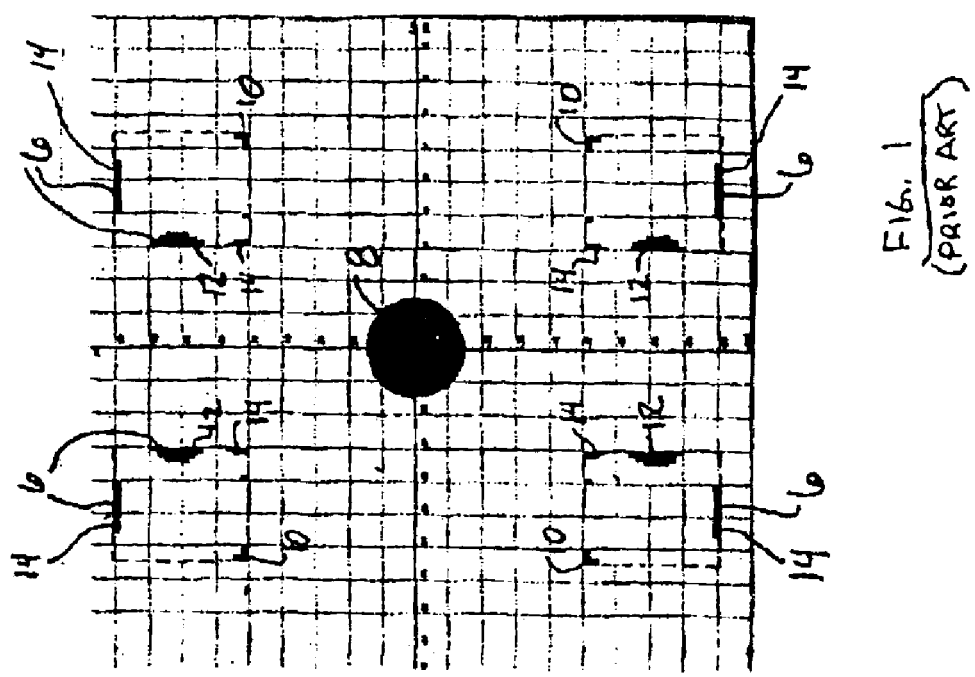
FIG. 1 is a cross-sectional area plot of a superconducting magnet and imaging volume for a typical Magnetic Resonance Imaging (MRI) system having an open architecture.

In each of the following figures, the same reference numerals are used to refer to the same components. While the present invention is described with respect to a method and apparatus for generating a uniform magnetic field in an imaging volume, the present invention may be adapted to be used in various systems including: Magnetic Resonance Imaging (MRI) systems, magnetic resonance spectroscopy systems, and other applications that require a uniform magnetic field.

In the following description, various operating parameters and components are described for one constructed embodiment. These specific parameters and components are included as examples and are not meant to be limiting.

Also in the following description, a MRI system component may include any one of the following: a superconducting magnet, a superconducting magnet support structure, a gradient coil assembly, a cryostat, a cryocooler, a cryostat support structure, or any other MRI system component known in the art.

Figure 3:
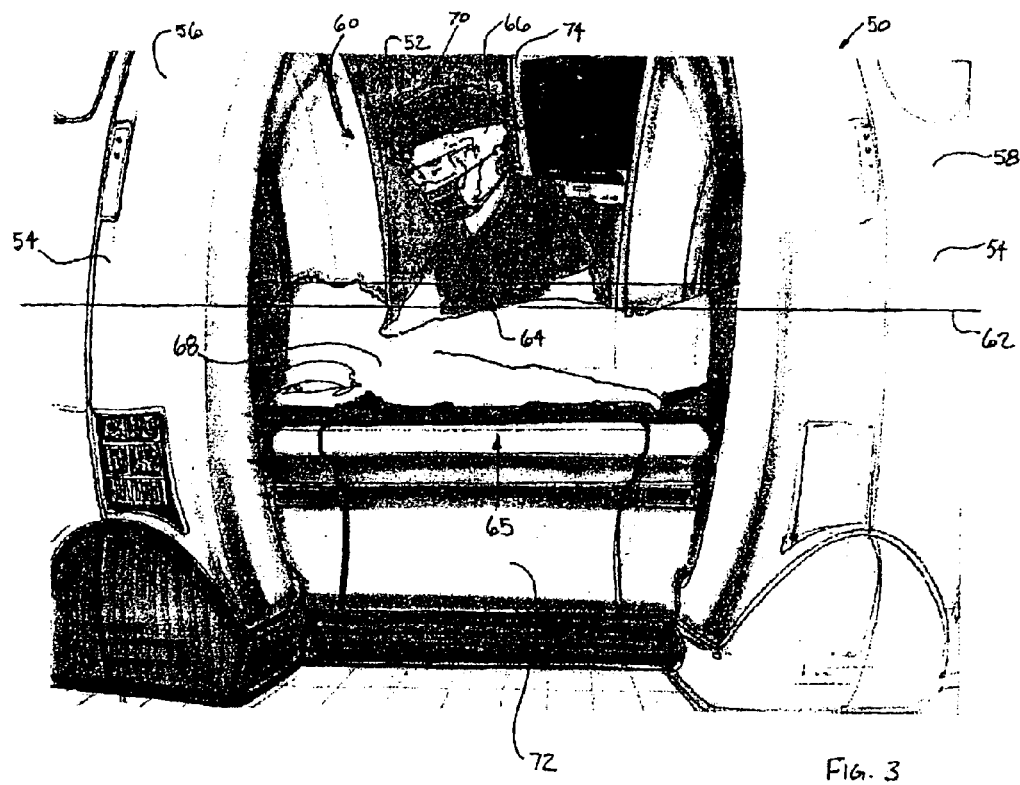
FIG. 3 is a pictorial view of a MRI system having an open architecture and containing a pulsed readout magnet in accordance with an embodiment of the present invention.

Referring now to FIG. 3, a pictorial view of a MRI system 50 having an open architecture and containing a pulsed readout magnet in accordance with an embodiment of the present invention, is shown. The MRI system 50 is within an unshielded or lightly shielded MRI room 52 and includes a first superconducting magnet assembly 54 having a fore section 56 and an aft section 58. The assembly forms an imaging volume 60 (patient bore) therein having a center axis 62 with a center point 64, corresponding to a center 65 of the imaging volume 60. A treating physician 66 examines a patient 68 in an open area 70, having width W, between the fore section 56 and the aft section 58. The patient 68 lies on a table 72 extending along the center axis 62 and within the imaging volume 60. The MRI system 50, of the present invention, allows width W to be adjusted to alter the size of the open area 70 and allow the physician 66 to perform various tasks with more access to the patient, or at lower cost than the open architecture MRI systems of prior art. Data received from the magnet assembly 54 is viewed on a monitor 74.

Figure 4:
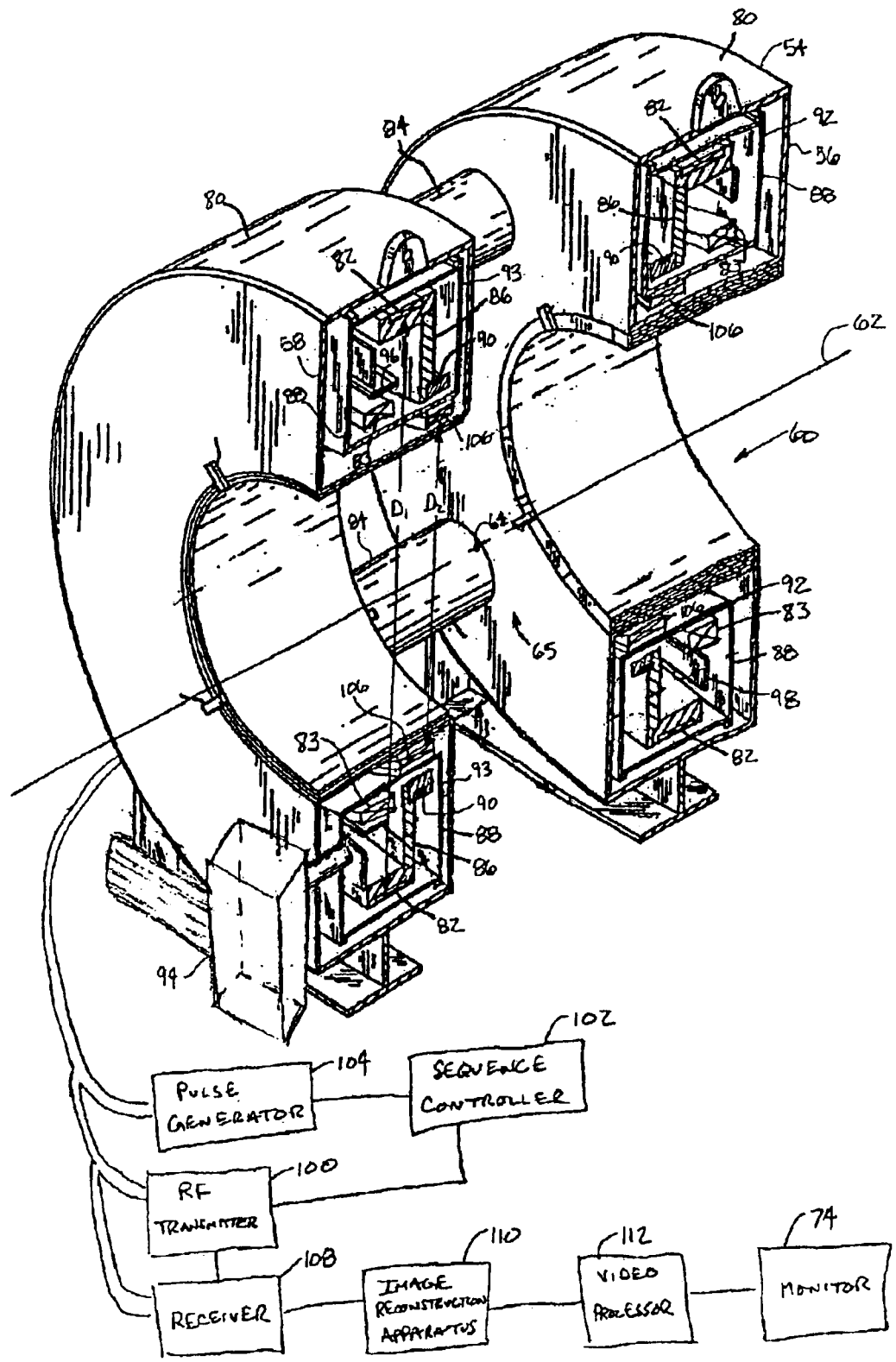
FIG. 4 is a perspective block diagrammatic view of the MRI system of the present invention in accordance with an embodiment of the present invention.

Referring now to FIG. 4, a perspective block diagrammatic view of the MRI system 50 in accordance with an embodiment of the present invention, is shown. The magnet assembly 54 includes a static magnet structure 80 that has a first superconducting magnet 82 with a first inner diameter $D_1$. The superconducting magnet 82 represents active shield coils (not shown). The magnet assembly 54 also includes a second superconducting magnet 83 that represents main coils (not shown). The superconducting magnet 82 generates a temporally constant magnetic field along the central axis 62 (z-axis) of the imaging volume 60. The fore section 56 and the aft section 58 may be coupled together by spacers 84 or by other methods known in the art. The superconducting magnet 82 is supported by a superconducting magnet coil support structure 86 and received in a cryostat 88. The support structure 86 provides support for static loads generated by the superconducting magnet 82 or by one or more correction magnets 90. The correction magnets 90 are statically activated, similar to the superconducting magnet 82, and may be used to aid in shaping the magnetic field. Cryostat 88 includes toroidal helium vessels 92 and 93 and is coupled to a cryocooler assembly 94. The cryocooler assembly 94 maintains the helium vessels 92 and 93 at proper operating temperatures. A superconducting switch 96, and associated end rings 98, are also included within helium vessels 92 and 93 to support the support structure 86.

A RF transmitter 100 is connected to a sequence controller 102 and a primary RF coil, a fixed body RF coil, or local surface coils (all of which are not shown). The RF transmitter 100 is preferably digital. The sequence controller 102 controls a current pulse generator 104 that is coupled to a resistive readout magnet 106. The sequence controller 102, in conjunction with RF transmission information from the RF transmitter 100, generates RF pulses within the imaging volume 60.

The sequence controller 102 is preferably microprocessor based such as a computer having a central processing unit, memory (RAM and/or ROM), and associated input and output buses. The sequence controller 102 may be software or hardware based and may be part of a single main controller or may be a separate stand-alone controller.

The readout magnet 106 may be of various size, style, and shape and may be located in various locations relative to the superconducting magnet 82 and the imaging volume 60. Note that the readout magnet 106 is not limited to being resistive; the readout magnet 106 may be superconducting. In a preferred embodiment of the present invention the readout magnet 106 has a second inner diameter $D_2$, which is smaller than the first inner diameter $D_1$. The readout magnet 106 is also closer to the center 65 than the superconducting magnet 82. The closer proximity of the readout magnet 106 to the center 65 provides increased effectiveness. In general, magnetic field from a coil is inversely proportional to distance between the coil and a center such as center 65. Thus, close proximity of the readout magnet 106 provides increased field magnitude per unit current. As shown, the readout magnet 106 may be located between the superconducting magnet 82 and the center 65 or may be in various other locations relative to the superconducting magnet 82. The readout magnet 106 may be located within the cryostat 88 or may be located outside of and separate from the magnet assembly 54.

A radio frequency receiver 108 is coupled to the primary RF coil and demodulates magnetic resonance signals emanating from an examined portion of the patient 68. An image reconstruction apparatus 110 reconstructs the received magnetic resonance signals into an electronic image representation that is stored in an image memory. A video processor 112 converts stored electronic images into an appropriate format for display on the video monitor 74.

Figure 2:
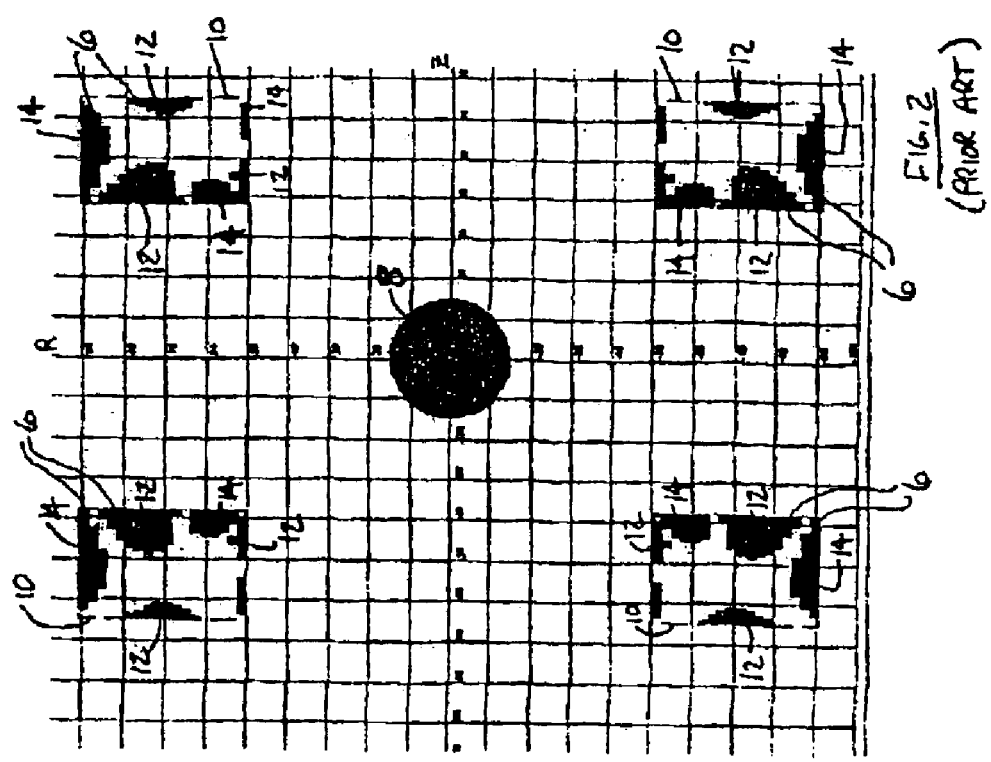
FIG. 2 is a cross-sectional area plot of a superconducting magnet and imaging volume for the typical MRI system with increased physician access and resultant increased superconducting magnet forces.
Figure 5:
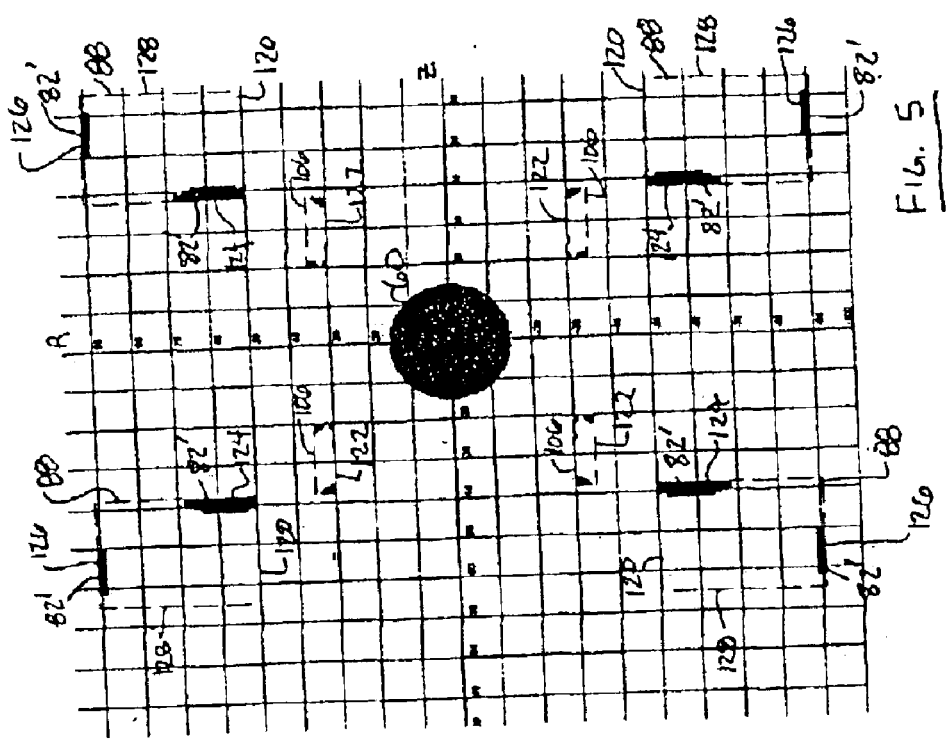
FIG. 5 is a cross-sectional area plot of a superconducting magnet and imaging volume for the MRI system of the present invention in accordance with an embodiment of the present invention.

Referring now to FIG. 5, a cross-sectional area plot of a 0.5 Tesla superconducting magnet 82', with a coil to coil gap (not shown) of approximately 76 cm, and imaging volume 60 for the MRI system 50 in accordance with an embodiment of the present invention, is shown. The vertical axis is R in centimeters, and the horizontal axis is Z also in centimeters. The first set of rectangular boxes 120 represent the cryostat 88. The second set of rectangular boxes 122 represent the readout magnet 106. The first magnetic areas 124 correspond to positive cross-sectional areas of the superconducting magnet 82', which are directly proportional to electromagnetic forces generated therein. The second magnetic areas 126 correspond to negative cross-sectional areas of the superconducting magnet 82', which are also directly proportional to electromagnetic forces generated therein. As illustrated, the magnetic areas 124 and 126 are relatively small in comparison to the cryostat cross-sectional area 128. The superconducting magnet 82', of this example, is approximately 67,750 cubic centimeters of superconductor, which is approximately ⅕ the superconductor required by the magnet 82' using prior art that is shown in FIG. 2. Therefore, the forces generated by the magnet assembly 54 of the present invention and the required superconductor are acceptable.

Figure 6:
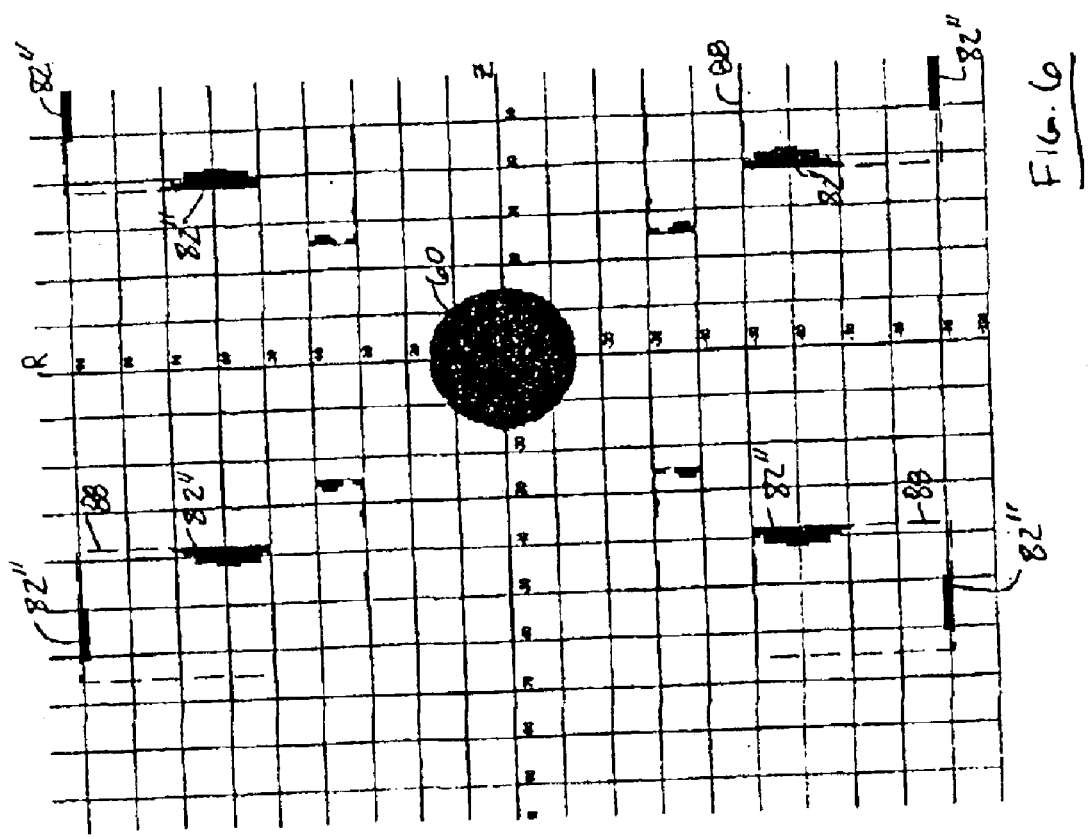
FIG. 6 is a cross-sectional area plot of a superconducting magnet and imaging volume for the MRI system of the present invention in accordance with another embodiment of the present invention.

Referring now to FIG. 6, a cross-sectional area plot of a superconducting magnet 82" and imaging volume 60 for the MRI system 50 in accordance with another embodiment of the present invention, is shown. The width W may be increased, although in doing so the superconducting magnet size and generated forces must increase to create the same uniform magnetic field. But as illustrated, the size of the superconducting magnet 82" remains feasible and contains approximately 78,356 cubic centimeters of superconductor.

Note the size of the superconducting magnets 82' and 82" in FIGS. 5 and 6 are simply meant for example purposes and may be of various size dependent upon the size of the open area 70.

Figure 7:
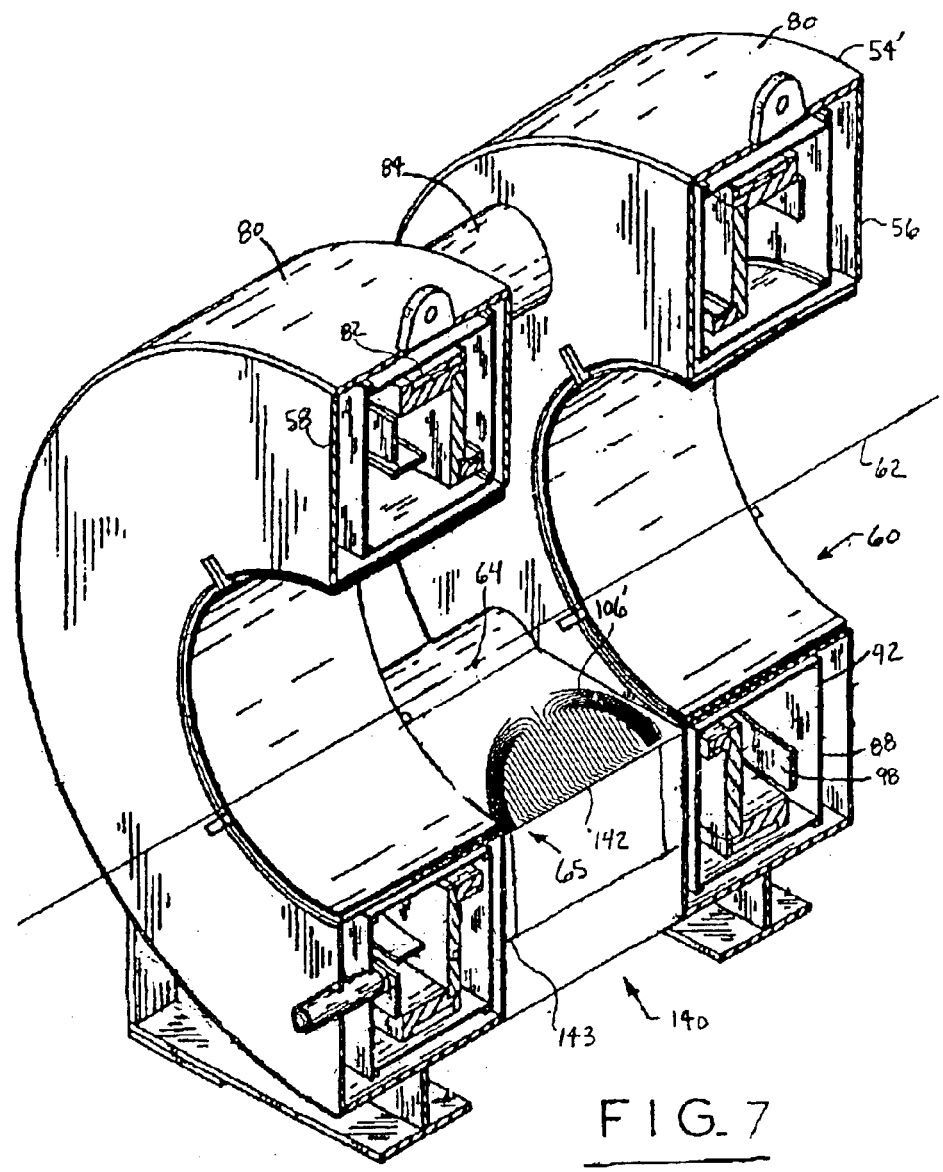
FIG. 7 is a perspective view of a superconducting magnet assembly incorporating a half moon configuration in accordance with an embodiment of the present invention.

Referring now to FIG. 7, a perspective view of a second superconducting magnet assembly 54' incorporating a half moon configuration 140 in accordance with an embodiment of the present invention, is shown. The half moon configuration 140 includes a readout magnet 106' that is in the form of a pair of radially shaped half moon magnets located between the superconducting magnet 82 and the center 65 in a housing 142 on a magnet stand 143. The housing 142 is coupled between the fore section 56 and the aft section 58 and is below the imaging volume 60. The half moon configuration 140 is an example that illustrates the flexibility in design choices with the present invention.

Figure 8:
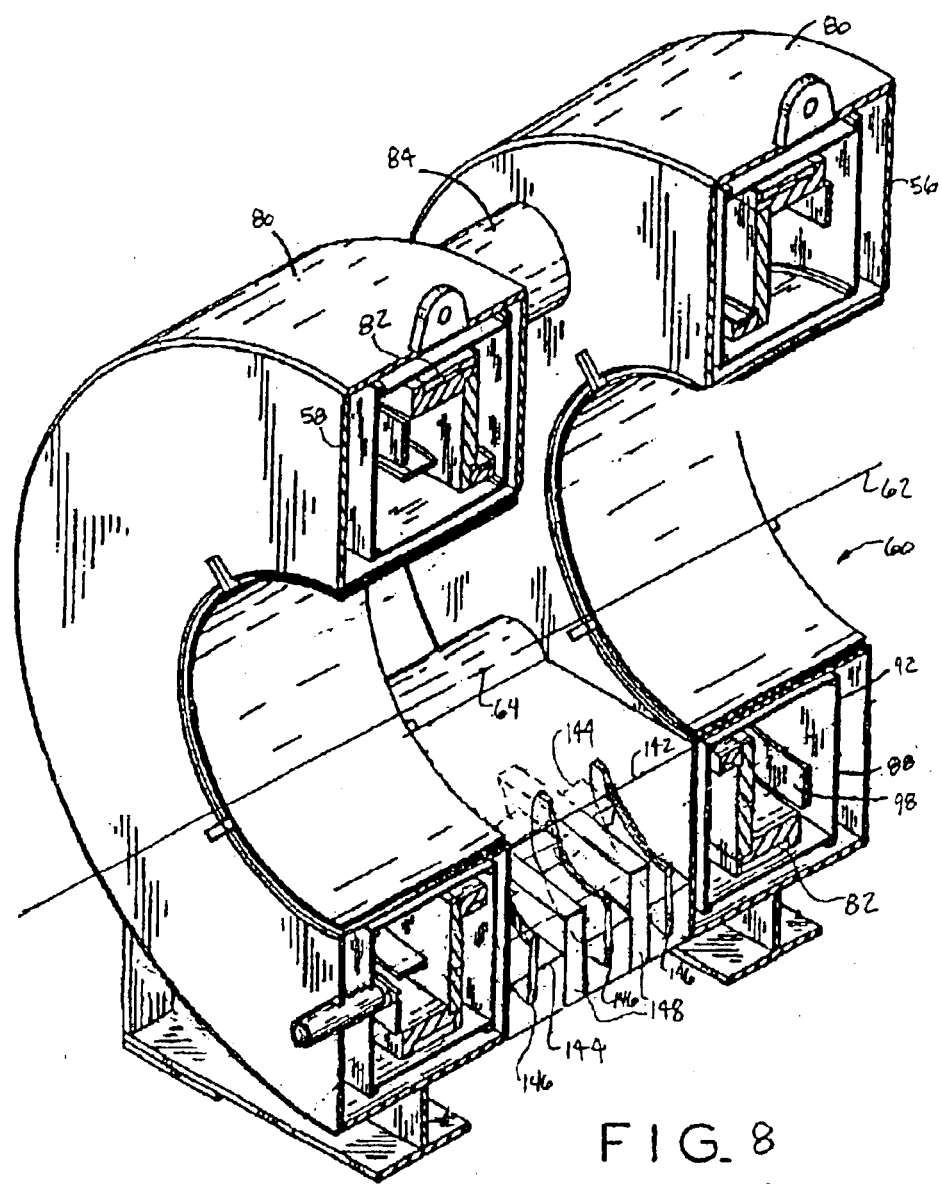
FIG. 8 is a perspective view of a superconducting magnet assembly incorporating additional static magnets in accordance with an embodiment of the present invention.

Referring now to FIG. 8, a perspective view of a third superconducting magnet assembly 54" incorporating additional static magnets 144 in accordance with an embodiment of the present invention, is shown. The static magnets 144 may be formed of a permanent magnet material or of iron or other magnetic material known in the art. A readout magnet 106" may be in the form of multiple half-rings 146. The static magnets 144 are coupled to structural members 148, which are mechanically coupled to the housing 142. The members 148 separate each half-ring 146 and maintain proper positioning of the static magnets 144 and the readout magnet 106". The half-rings 146 are mechanically coupled to and supported by the static magnets 144 and members 148.

Various parameters associated with the readout magnet 106" and the static magnets 144 may be adjusted to form the magnetic field. The various parameters may include shape, size, material type, location, and other parameters known in the art. The present invention may also incorporate additional static magnets 144 to further shape the magnetic field.

Figure 9:
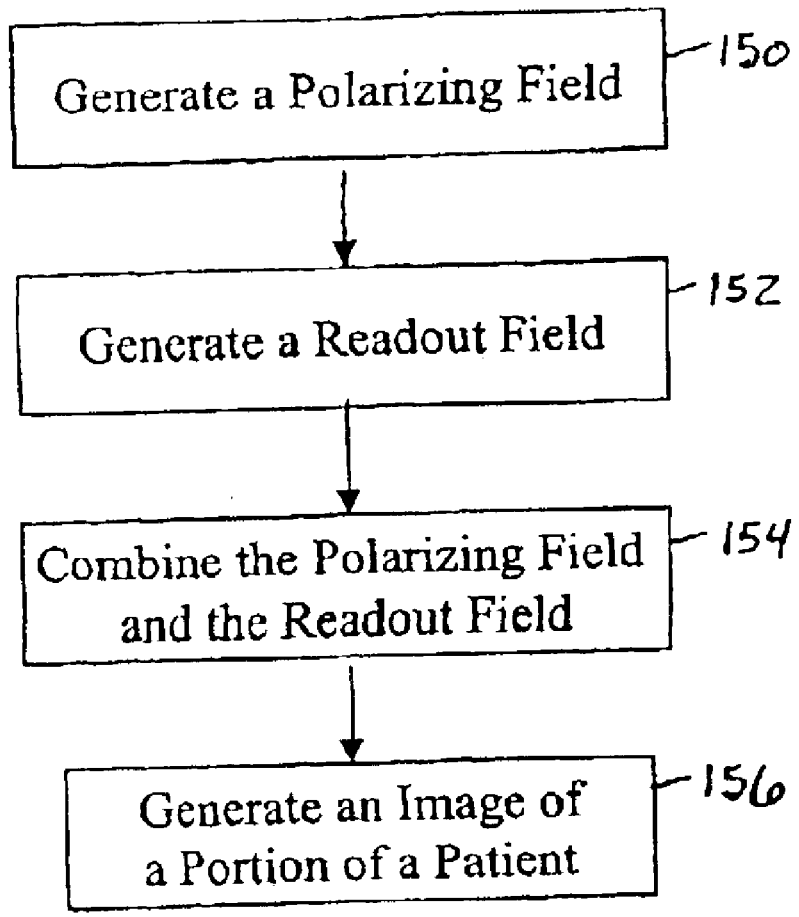
FIG. 9 is a logic flow diagram illustrating a method of forming a uniform magnet field through an imaging volume of the MRI system of the present invention in accordance with an embodiment of the present invention.

Referring now to FIG. 9, a logic flow diagram illustrating a method of forming a uniform magnetic field through the imaging volume 60 of the MRI system 50 in accordance with an embodiment of the present invention, is shown.

In step 150, the superconducting magnet 82 is activated to generate a polarizing field in the imaging volume 60. The polarizing field is generated having a relatively poor homogeneity field distribution.

In step 152, the sequencing controller 102 pulses the readout magnet 106, via the pulse generator 104, to generate a readout field in the imaging volume 60. The readout field has a relatively good homogeneity field distribution of low electromagnetic energy relative to the polarizing field. For example, the polarizing field may have an electromagnetic field of 0.48 T and the readout magnet may have an electromagnetic field of 0.02 T.

In step 154, the sequencing controller 102 combines the readout field with the polarizing field within the imaging volume 60 to create the uniform magnetic field of which an image is formed from a portion of the patient 68. Although step 154 is shown as a separate step, as the readout field is generated, it is inherently combined with the polarization field, due to spatial proximity.

In step 156, the uniform magnetic field is provided across the patient, while gradient coils and RF coils manipulate the magnetic field across the examined portion of the patient 68. The receiver 108 demodulates magnetic resonance RF signals emanating from the examined portion of the patient 68. These signals are then reconstructed to create an electronic image, which is viewed on the monitor 74.

The present invention therefore provides a MRI system that is operable in an unshielded or lightly shielded room, feasible to build, and generates a uniform magnetic field of high uniformity. The MRI system of the present invention also provides multiple design configurations and pulse sequencing options allowing versatility in highlighting various medical conditions.

The above-described apparatus, to one skilled in the art, is capable of being adapted for various purposes and is not limited to the following systems: Magnetic Resonance Imaging (MRI) systems, magnetic resonance spectroscopy systems, and other applications that require a uniform magnetic field. The above-described invention may also be varied without deviating from the spirit and scope of the invention as contemplated by the following claims.

What is claimed is:

1. A magnetic resonance imaging system comprising:
   a superconducting magnet coil assembly comprising a superconducting magnet and forming a imaging volume, said superconducting magnet generating a polarizing field in said imaging volume;
   a resistive readout magnet generating a readout field in said imaging volume; and
   a controller electrically coupled to the resistive readout magnet and pulsing said resistive readout magnet to generate a uniform magnetic field through said imaging volume.

2. A system as in claim 1 wherein the sum of said readout field added to said polarizing field is of good homogeneity relative to said polarizing field.

3. A system as in claim 1 wherein said resistive readout magnet is in a half moon configuration.

4. A system as in claim 3 wherein said half moon configuration comprises:
   a pair of radially shaped half moon magnets;
   a magnet stand mechanically coupled to and supporting said pair of radially shaped half moon magnets; and
   a housing mechanically coupled to said superconducting magnet coil assembly and said magnet stand, said housing containing said pair of radially shaped half moon magnets and said magnet stand.

5. A system as in claim 1 further comprising one or more correction magnets.

6. A system as in claim 1 further comprising one or more static magnetic sources that further shape said uniform magnetic field.

7. A system as in claim 1 further comprising:
   said readout magnet comprising one or more multiple half-rings;
   one or more static magnetic sources mechanically coupled to and supporting said resistive readout magnet, said one or more static magnetic sources further shaping said uniform magnetic field;
   one or more dividers separating said one or more multiple half-rings; and
   a housing mechanically coupled to said dividers and said one or more static magnetic sources and containing said resistive readout magnet, said one or more static magnetic sources, and said one or more dividers.

8. A system as in claim 1 wherein said superconducting magnet has a first inner diameter and said resistive readout magnet has a second inner diameter that is smaller than said first inner diameter.

9. A system as in claim 1 wherein said resistive readout magnet is spatially closer to a center point, corresponding to a center of said imaging volume, on said center axis than said superconducting magnet.

10. A system as in claim 1 further comprising a cryostat cooling and containing said superconducting magnet and said readout magnet.

11. A system as in claim 1 wherein said polarizing field is static and has a non-homogeneous field distribution and said readout field has a field distribution of low electromagnetic energy relative to said polarizing field which produces a uniform field when added to the polarizing field.

12. A magnetic resonance imaging system comprising:
    a superconducting magnet coil assembly comprising a superconducting magnet and forming a imaging volume, said superconducting magnet generating a static non-homogeneous polarizing field in said imaging volume;
    a resistive readout magnet generating a readout field in said imaging volume, said readout field having a field distribution of low electromagnetic energy relative to said polarizing field which adds to the static polarizing field to produce a uniform field; and
    a controller electrically coupled to the resistive readout magnet and pulsing said resistive readout magnet to generate a uniform magnetic field through said imaging volume.

13. A system as in claim 12 wherein said resistive readout magnet is spatially closer to a center point, corresponding to a center of said imaging volume, on said center axis than said superconducting magnet.

14. A system as in claim 12 wherein said resistive readout magnet is in a half moon configuration.

15. A system as in claim 14 wherein said half moon configuration comprises:
    a pair of radially shaped half moon magnets;
    a magnet stand mechanically coupled to and supporting said pair of radially shaped half moon magnets; and
    a housing mechanically coupled to said superconducting magnet coil assembly and said magnet stand, said housing containing said pair of radially shaped half moon magnets and said magnet stand.

16. A system as in claim 12 further comprising one or more static magnetic sources that further shape said uniform magnetic field.

17. A system as in claim 12 further comprising:
    said resistive readout magnet comprising one or more multiple half-rings;
    one or more static magnetic sources mechanically coupled to and supporting said resistive readout magnet, said one or more static magnetic sources further shaping said uniform magnetic field;
    one or more dividers separating said one or more multiple half-rings; and
    a housing mechanically coupled to said dividers and said one or more static magnetic sources and containing said resistive readout magnet, said one or more static magnetic sources, and said one or more dividers.

18. A method of forming a uniform magnet field through a imaging volume of a magnetic resonance imaging system comprising:
    activating a superconducting magnet to generate a polarizing field in the imaging volume;
    pulsing a resistive readout magnet to generate a readout field in the imaging volume; and
    combining the polarizing field with the readout field.

19. A method as in claim 18 wherein activating a superconducting magnet comprises generating a static polarizing field that has a non-homogeneous field distribution.

20. A method as in claim 18 wherein pulsing a resistive readout magnet comprises generating a readout field that has a uniform field distribution of low electromagnetic energy relative to said polarizing field.

* * * * *

UNITED STATES PATENT AND TRADEMARK OFFICE
CERTIFICATE OF CORRECTION

PATENT NO. : 6,914,431 B2 Page 1 of 1
APPLICATION NO. : 10/249089
DATED : July 5, 2005
INVENTOR(S) : Timothy J. Havens It is certified that error appears in the above-identified patent and that said Letters Patent is hereby corrected as shown below:

Column 7, line 42, should read as follows:

-- said resistive readout magnet comprising one or more multiple --

Signed and Sealed this

Nineteenth Day of September, 2006

JON W. DUDAS
*Director of the United States Patent and Trademark Office*

UNITED STATES PATENT AND TRADEMARK OFFICE
CERTIFICATE OF CORRECTION

PATENT NO. : 6,914,431 B2  Page 1 of 1
APPLICATION NO. : 10/249089
DATED : July 5, 2005
INVENTOR(S) : Timothy J. Havens It is certified that error appears in the above-identified patent and that said Letters Patent is hereby corrected as shown below:

Column 7, line 42, should read as follows:

-- said resistive readout magnet comprising one or more multiple --

Signed and Sealed this

Sixth Day of February, 2007

JON W. DUDAS
*Director of the United States Patent and Trademark Office*